United States Patent [19]

Iversen

[11] Patent Number: 4,712,609

[45] Date of Patent: * Dec. 15, 1987

[54] HEAT SINK STRUCTURE

[76] Inventor: Arthur H. Iversen, 15315 Sobey Rd., Saratoga, Calif. 95070

[*] Notice: The portion of the term of this patent subsequent to Jun. 19, 2001 has been disclaimed.

[21] Appl. No.: 699,429

[22] Filed: Feb. 7, 1985

Related U.S. Application Data

[63] Continuation-in-part of Ser. No. 673,839, Nov. 21, 1984, abandoned.

[51] Int. Cl.$^4$ .......................... F28F 3/06; H01L 23/36
[52] U.S. Cl. ................................... 165/80.4; 165/133; 357/82; 361/385
[58] Field of Search ...................... 165/80 C, 133, 80.3, 165/80.4; 357/68, 74, 80, 82; 361/385, 401

[56] References Cited

U.S. PATENT DOCUMENTS

| | | | |
|---|---|---|---|
| 3,361,195 | 1/1968 | Meyerhoff et al. | 361/385 X |
| 3,433,632 | 3/1969 | Elbert et al. | 75/222 |
| 3,780,352 | 12/1973 | Redwanz | 357/74 X |
| 3,788,393 | 1/1974 | Plizak | 165/80 C X |
| 4,126,879 | 11/1978 | Kessler, Jr. et al. | 357/82 |
| 4,216,826 | 8/1980 | Fujikake | 165/133 |
| 4,381,818 | 5/1983 | Sachar et al. | 165/133 |
| 4,405,876 | 9/1983 | Iverson | 313/30 |
| 4,434,842 | 3/1984 | Gregory | 165/133 |
| 4,455,504 | 6/1984 | Iversen | 313/30 |
| 4,622,687 | 11/1986 | Iversen et al. | 378/130 |

OTHER PUBLICATIONS

Boiling Burnout with Water in Vortex Law, Jambell and Green Chemical Eng. Prog. 54,10, 1958, pp. 68–76, pp. 23–26, J. Holdway, Electri–onics, Jan. 1985.

*Primary Examiner*—Albert W. Davis, Jr.
*Assistant Examiner*—Peggy Neils
*Attorney, Agent, or Firm*—Foley & Lardner

[57] ABSTRACT

There is disclosed a novel high heat flux liquid cooled semi-conductor heat sink structure suitable for mounting semi-conductor chips such as IC's, hybrids, lasers, and power semi-conductors, said heat sink being made of metals, such as tungsten or Molybdenum; ceramics such as alumina, Beryllia, aluminum nitride, silicon carbide or variants thereof or other suitable material such as crystalline carbon, said semi-conductor heat sink structure including at least one surface suitable for bonding one or more semi-conductor chips in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, the improvement wherein said heat exchange surface includes: means disposed on said heat exchange surface for forming pressure gradients in said liquid having a component perpendicular to said heat exchange surface without substantially impeding the relative velocity between the anode heat exchange surface and said liquid, said component having a magnitude directly proportional to the square of the relative velocity between said anode heat exchange surface and said liquid, to facilitate removal of said nucleate bubbles.

31 Claims, 2 Drawing Figures

HEAT SINK STRUCTURE

This application is a continuation-in-part of U.S. patent applicaton Ser. No. 673,839 filed Nov. 21, 1984, now abandoned.

DESCRIPTION

1. Technical Field

The present invention relates to the removal of heat from semi-conductors and particularly concerns means for the efficient cooling of semi-conductor devices.

2. Background of the Invention

The need for more efficient heat removal from semi-conductor devices has become more important as design rules for IC's shrink and power levels of power devices such as diodes and SCR'S increase. Bipolar and power MOS FETs devices are high in power consumption, and thus as rule size decreases to increase device density and speed, heat flux increases.

State of the art heat flux removal for semi-conductors is about 10-20 w/cm$^2$. In wafer scale integration and using water cooling, 50 w/cm$^2$ has been reported at the cost of a large and bulky structure. Gas cooled systems using helium also result in relatively large and bulky structures with relatively low heat flux capabilities. Power devices are currently limited by package heat dissipation characteristics. Using thick disc type construction called "hockey puck" as described in Electronics Week, Oct. 8, 1984, pg. 67, power devices with ratings such as 1400 A at 1800 V are made in a 100 MM "puck". These devices are often difficult to mount and can be bulky.

The need exists for semi-conductor heat removal structures that can handle higher heat fluxes, are more compact and less costly.

SUMMARY OF THE INVENTION

The present invention provides a liquid cooled semi-conductor heat sink that can dissipate heat flux that is an order of magnitude greater than currently available.

The present invention provides a liquid cooled semi-conductor heat sink that is smaller and lighter than high flux heat sinks currently in use.

The present invention further provides a liquid cooled semi-conductor heat sink that enables efficient use of dielectric liquid coolants thereby avoiding the electrical leakage and corrosion that can result from the use of water coolant.

The present invention provides a liquid cooled semi-conductor heat sink that enables controlled temperature operation of semi-conductor devices.

The present invention provides a liquid cooled semi-conductor heat sink of efficient operation that enables the choice of coolant to be made on the basis of non-toxcity or other criteria and not on thermal efficiency considerations.

DESCRIPTION OF PREFERRED EMBODIMENTS

Figure 1:
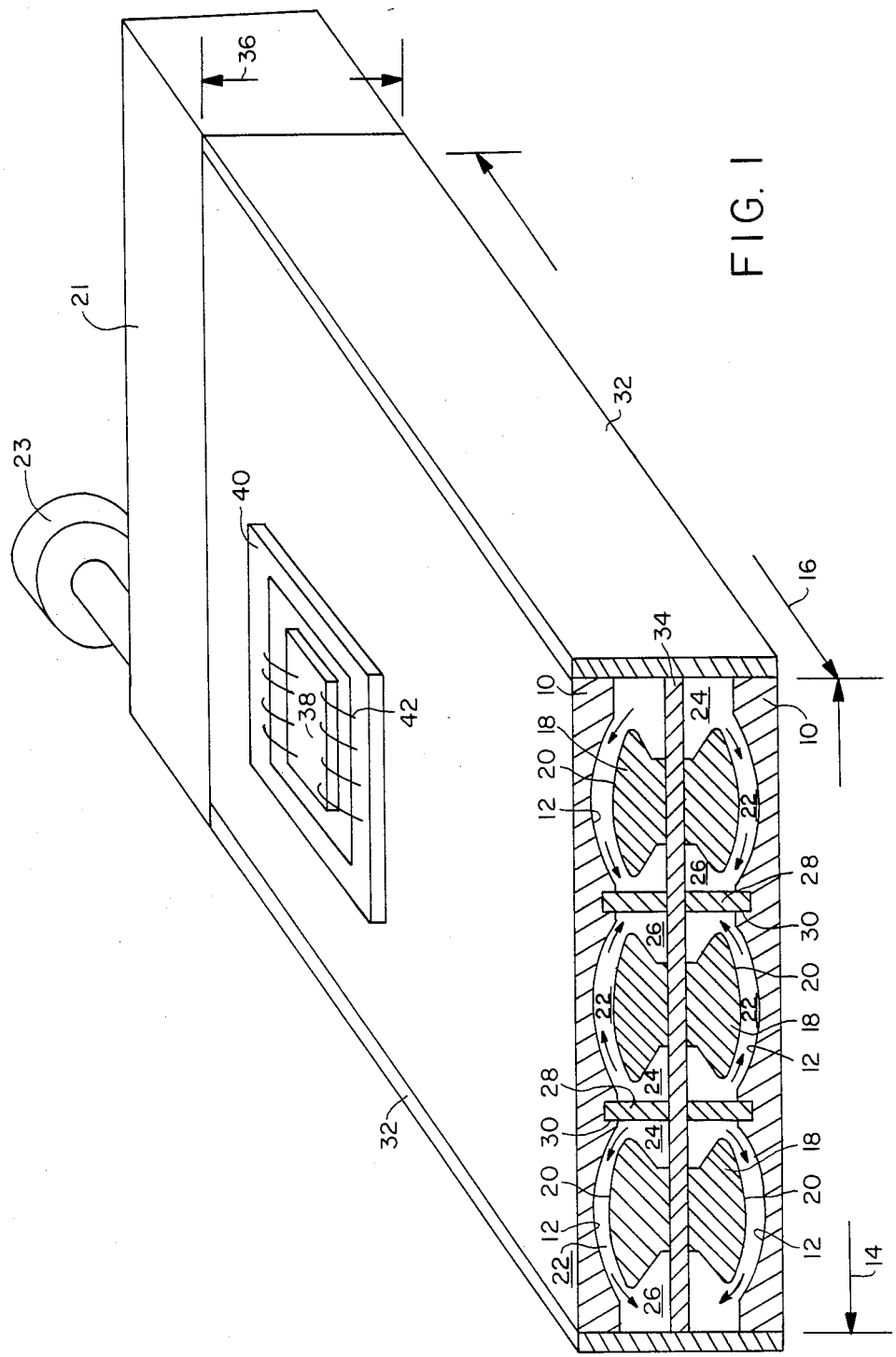
FIG. 1 is a perspective view of a semi-conductor heat sink subassembly according to the present invention.

The most efficient method for the liquid cooling of a heat exchange surface is by nucleate boiling while the liquid is in turbulent flow over the heat exchange surface.

The work of Gambill and Greene at Oak Ridge National Laboratories (Chem. Eng. Prog. 54,10, 1958) theoretically and experimentally demonstrated that by using a vortex coolant flow in a heated tube, power dissipations 4 to 5 times greater than that possible by linear coolant flow could be achieved. The vortex flow, a helical motion of the liquid coolant down the inside of a heated tube generates pressure gradients normal to the tube wall by centrifugal force as it rotates down the tube toward the discharge end and, according to Gambill and Greene, provides a mechanism of vapor transport (nucleate bubble removal) by centrifugal acceleration. The design of Gambill and Greene suffers from the shortcoming that it operates at large L/D ratios. This results in high pressure drops and rapid deterioration of the swirl flow and associated heat transfer characteristics as the fluid rotates through many turns.

By making use of the centrifugal force associated with the Gambill and Greene experiment but avoiding the specified swirl flow geometry, performance superior to the Gambill and Greene design can be obtained without its shortcomings. U.S. Pat. Nos. 4,405,876 issued 9/20/83 and 4,455,504 issued 6/19/84 to A. Iversen and pending U.S. patent application Ser. No. 559,355 filed 10/14/83 to Whitaker and Iversen describe the application of these principles to vacuum tubes. This is accomplished by having a short coolant flow path, L, and a large D. For each halving of the L/D, the rule of thumb is that heat transfer increases by 15%.

As described in the aforementioned Iversen patents, heat exchange is further enhanced by the preparation of nucleating site cavities on the heat exchange surface that are of optimum dimensions and spacing on the heat exchange surface such that maximum heat flux removal is achieved without encountering the destructive condition of film boiling. Cavity dimensions may range from 0.002 mm to 0.2 mm and spacing between cavities on the heat exchange surface may range from 0.03 mm to 3 mm. This specified geometry of nucleating cavity dimensions and spacing between cavities may be achieved chemically by chemical milling, electronically by lasers or electron beams or mechanically by drilling, hobbing, etc. The inside surfaces of the cavities serving as nucleating sites are further prepared with micro cavities, preferably reentrant, with dimensions generally in the range of $10^{-4}$ to $10^{-2}$ mm. Micro cavities serve as permanent vapor traps that remain in equilibrium with the liquid under all conditions, including those of lowest temperature and highest pressure, and serve as the initial nucleate boiling sites until the larger cavities commence nucleate boiling. Thus, full scale nucleate boiling becomes a two step affair, with initial nucleate boiling taking place at the trapped vapor sites, and then when sufficient vapor has been accumulated in the larger cavities, they take over. Micro cavities act much like the starting motor in an automobile. Micro cavities may be created by judicious selection of diamond, or other cutting material, particle size which is embedded in the drill bit. With the laser, reactive vapors or gases may be introduced which react with the anode material to create the desired pitting effect. Also, the outer surface of the truncated cone may also possess micro cavities due to the laser melting of material and subsequent deposition action at the edge of the cavity.

Also, heat transfer is further enchanced by breaking up the viscous sublayer by providing roughness height on the heat transfer surface that range from about 0.3 the thickness of the viscous sublayer to about several times the height of the combined thickness of the viscous sublayer and transistion zone. In general, this height, i.e., the height of the truncated cone, would range from 0.0001" to about 0.008".

Another method of obtaining a surface with crevices for forming nucleate bubbles is the use of a thin porous metal layer adherent to the anode at the anode heat exchange surface. Relatively uniform pore size can be obtained by fabricating the porous structure from metal powders with a narrow range of particle sizes. Methods, such as described in U.S. Pat. No. 3,433,632 are well suited to providing the desired porous metal structure.

Referring now to FIG. 1, shown is a semi-conductor chip substrate 10 suitable for mounting a number of semi-conductor chips 38, which may, for example, be I.C.'s, hybrids, lasers or power devices or any combination thereof. In general, it is desirable that the substrate 10 have high thermal conductivity and have a thermal coefficient of expansion that adequately matches that of the semi-conductor chip material, be it silicon, germanium, gallium arsenide or other III-V semi-conductor compounds. In addition, the substrate should have sufficient mechanical strength to permit handling, sealing to other structures, etc. Suitable materials include metals such as molybdenum, tungsten and zirconium; ceramics such as silicon carbide, alumina, beryllia, aluminum nitride, and varients thereof. Other materials, such as crystalline carbon, which has minimum powdering characteristics, may be used.

The substrate 10 may be any of the above materials and is shown as a flat plate prepared with concave curved heat exchange surfaces 12 on the liquid cooled side. Shown are multiple adjacent curved surfaces 12 across substrate width 14 which when combined with a long length 16 of the curved surfaces 12 enables a substrate of arbitrarily large dimensions to be made. Dimensions may be of circuit board size. A preferred curve 12 would be circular and therefore the curved heat exchange surface 12 of the substrate may be characterized as being cylindrical along its length L 16. To obtain a chip mounting area, L 16×W 14, of relatively large dimensions, multiple adjacent concave curves 12 may be formed on the liquid cooled side.

Shown is a double sided substrate structure 11 composed of two identical substrates 10 thereby enabling both sides to be used for mounting chips, thus providing efficiency of use. Flow diverters 18 are provided with convex curved surfaces 20 which are placed in close proximity to heat exchange surfaces 12 forming conduit 22 for the the precise control of the flow of liquid coolant over heat exchange surface 12. Incoming liquid coolant from conduits 24 flows over the curved heat exchange surfaces 12 while passing through conduits 22. The velocity of liquid flow over curved heat exchange surface 12 is in the turbulant region for efficient heat transfer. In flowing over concave heat exchange surface 12, a pressure gradient, having a component perpendicular to the heat exchange surface is created in the liquid by a centrifugal force that is proportional to the square of the velocity of the coolant with respect to the curved surface. This pressure gradient more readily removes nucleate bubbles thereby improving cooling efficiency as described in the aforementioned Iversen patents. After passing over heat exchange surface 12, the coolant enters discharge conduit 26. To further reduce pressure drops, multiple input 24 and output 26 conduits may be connected in parallel.

In general, the cooler a semi-conductor chip operates, the better its operating characteristics. In the nucleate boiling regime, the heat exchange surface 12 will operate at the boiling temperature of the coolant, i.e. a constant temperature structure. The top surface of the chip 38 with the active devices such as diodes, transistors etc., will operate at some temperature, depending on the heat flux generated, above the temperature of the heat exchange surface 12.

Two classes of operation may now be examined. A sealed closed loop liquid cooling system containing the substrate structure has further heat exchange means (not shown) connected to a suitable second thermally related refrigeration system. The closed loop containing the substrate is filled with a dielectric coolant such as refrigerant #113 or #114B2 which boil at about 47° C. (118° F.). With #113 or #114B2, the sealed loop would be substantially at atmospheric pressure inasmuch that in all reasonable environments the temperature is likely to be below the boiling point of 47° C. (118° F.) when the semi-conductors are not operating. When the various semi-conductor devices function, the heat exchange surface 12 will elevate to the boiling point of the coolant and efficient cooling will then take place.

The second mode of operation is to fill the sealed loop containing the substrate with a low temperature boiling coolant such as refrigerant #12B1 which boils at −58° C. In these circumstances, the sealed loop will be under great pressure at room temperature (25° C.) and special care will be required to prevent distortion or rupture of the substrate structure. To this end, spanning diaphrams 28 are brazed to the substrate surface at the juncture 30 of adjacent curved surfaces 12 either along the entire length L 16 or at periodic intervals. If needed, suitable stiffening means (not shown) can also be provided in the width W 14 direction at periodic intervals along the length L 16. Shown are slots at the juncture of adjacent curved surfaces 30 provided in the substrate surface that enables "floating" alignment as well as a receptacle for small diameter braze wires and diaphrams 28. For example, the diaphram members 28 may be from 0.005" to 0.020" thick with slots slightly wider. The depth of the slot is made slightly deeper than required for both the braze wire and diaphram 28, thus the "floating" action aligns the diaphram 28 prior to brazing without affecting the dimensions of conduit 22 which should be uniform. To obtain precise dimensions for conduit 22, spacing jigs, substantially equal to the spacing between surfaces 12 and 20, that is, the height of conduit 22, which may be curved to correspond to curved surfaces 20 and 12 are placed between substrates 10 and flow diverter 18 in preparation for brazing. Diaphrams 28 with brazing wire are emplaced in slots at 30 and end plates 32 are fixtured with brazing material to the sides of substrates 10. Periodically positioned flow diverter support rods 34 or other means are set to be brazed to end plates 32, diaphrams 28 (if used) and flow diverters 18. Upon brazing, a stiff rigid assembly is formed. The spacing jigs used to form conduits 22 are then removed. One end of the substrate assembly may be used for coolant input and the other for outflow. To facilitate this, at the output end a generally cupped end cap 21, with liquid porting means such as "quick disconnects" 23 are brazed or welded on and input conduits 24 and conduits 22 are blocked off in the same fashion. In this way all input and output conduits are fed in parallel. Suitable coupling means, such as tubing or "quick disconnects", are provided to enable incorporation into the liquid cooling loop. The above described high pressure substrate assembly is best made from a metal such as tungsten or molybdenum inasmuch that in thin members, metals form much stronger structures than do ceramics which have been metallized and brazed.

Pressurization is low for the substrate sub-assembly that will use coolants boiling above room temperature and that operate sub-cooled. Therefore, strength is generally not a problem though pressure equalizing means, such as a bellows, may be desirable. Thus, ceramic substrate materials, as previously described, may be used. Also diaphram members 28 may not be needed and, adhesives may be used instead of brazing to join the various pieces together. In general, the thickness 36 of the substrate structure or circuit board may range from $\frac{1}{8}''$ to $\frac{1}{4}''$. It may be mounted like circuit boards in a electronic chassis.

In the cooled structure that operates below room temperature, it may be desirable to provide a suitable thickness of insulation such as foamed urethane over the substrate sub-assembly for low temperature operation. To enable simple removal of the insulation, a suitable release agent may be coated on the substrate structure and semi-conductor devices. This inhibits the formation of ice on the surface of the substrate due to condensation. Also, warming means such as a "heating sock", i.e., fabric with embedded heating wires may be placed on the outside surface of the insulation such that the dew point temperature lies within the insulation and condensation can be avoided. A further insulation technique comprises sliding a pre-formed insulating sleeve over the substrate structure and sealing it in place. Upon failure of a device this enables simple removal of the insulating sleeve and easy replacement of the semi-conductor device.

The use of non-conductive refrigerant coolants, high or low temperature, has the further benefit of avoiding electrical short circuits or corrosion as water would do in the event of a seal failure. This has special importance for use with power devices where destruction of an entire system could result. The high cooling efficiency of the present invention further permits the use of less efficient but less toxic coolants (refrigerants). Also, corrosion, chemical or electrochemical is avoided with the use of dielectric coolants when using metals substrates such as molybdenum or tungsten. Both of these metals show appreciable corrosion in the presence of water.

The substrate structure, which may be the size of a circuit board or small enough to carry a single chip, has mounted on it semi-conductor device 38. The bottom surface of device 38 may be plated with gold or other solder material to enable a thermally intimate bond to be made to the outer surface of substrate 10. Said bonding may be by any of a number of acceptable methods. Electrical connection may be made by "solder bumps" on the chip; or to a plastic, ceramic or other dielectric material element 40 with electrical leads thereon which is also mounted on the substrate sub-assembly. Element 40 may be provided with a hole in its center to accommodate chip 38 thereby not affecting its heat transfer characteristics to substrate 10. Bonding wires 42 make electrical connections from 38 to 40. A flexible printed circuit (not shown) may be used to interconnect various chips on substrate 10. Conventional seals on top of chips may be used for mechanical protection. An alternative semi-conductor device and electrical connector mounting scheme is to mount the semi-conductor devices 38 in a line centered along each of the centers of the adjacent curves 12 located on the liquid cooled surface of the substrate. The electrical connector 40 may now be a narrow strip centered along and above juncture 30 of the multiple curved heat exchange surfaces 12. In this manner, optimum cooling is provided the semi-conductor devices.

The choice of metal, ceramic or other material for substrate 10 is dictated by the application. Although some ceramics such as Beryllia and Hitachi's Hitaceram (silicon carbide) have thermal conductivities greater than tungsten or molybdenum, their relatively fragile nature does not permit them to be made in large thin sections. The heat transfer equation is given by $T = To + q(b/k)$ where To is the boiling temperature of the coolant, b is the thickness of the substrate or chip and k is the thermal conductivity and q the heat flux. It is seen that the thickness b and thermal conductivity k can be offsetting parameters. That is, a lower thermal conductivity k can be offset by a thinner thickness b. This is very much the case then comparing ceramics with metals. A minimum practical thickness for a large ceramic substrate 10 is about $\frac{1}{2}$–1 mm (0.020″–0.040″), whereas a stiff and strong metal such as tunsgsten can be readily be made as thin as $\frac{1}{4}$ mm (0.010″). The much higher thermal conductivity of Hitaceram, 2.7 W/cm°C. as compared to 1.8 W/cm °C. for tungsten is more than offset by the much thinner thicknesses permissible with tungsten. In addition, low temperature, pressurized substrates are more practical with metals. Substrates with heat dissipation of 20-35 W/cm²°C. may be made of ceramic or metal. With incorporation of $\frac{1}{4}$ MM thick semi-conductor chips on the substrate, such as silicon, power dissipations in the range of 10–15 W/cm°C. are possible. For best characteristics, chip operation below 60° C. is generally recommended. Therefore, with a coolant that boils at 47° C. and a 57° C. operating temperature, i.e., a 10 temperature rise to the top of the chip, 100–150 W/cm² may be dissipated. This is substantially greater than state-of-the-art technique which is typically about 2° C./W for air cooled heat exchange structures, almost one and a half orders of magnitude less than the present invention, as high as 50 W/cm² for a water cooled unit used in wafer scale integration.

When using low boiling point coolants such as refrigerant #12B1 (−58° C.), two modes, or any degree there between, of operation are available. One mode of operation would operate relatively low power devices at low temperature (i.e., close to −58° C.) to achieve desired electrical characteristics. The second mode of operation would enable very high power (heat dissipation) devices to operate at moderate temperatures, i.e., room temperature. For example, operating a power semi-conductor at room temperature (25° C.) and using refrigerant #12B1 (−58° C.) in the substrate provides an 83° C. temperature rise. With a power dissipation capability of from 10–15 w/cm °C., an 83° C. temperature rise would provide a power dissipation of 830–1,250 w/cm², about two orders of magnitude beyond state of the art, while maintaining the surface temperature of the semi-conductor device at room temperature (25° C.).

Moreover, when packaged in this liquid cooled operating configuration, the controlled temperature of the substrate (the boiling point of the refrigerant) minimizes variations in operating characteristics of semi-conductor devices due to temperature changes caused by both ambient conditions and the devices themselves. Any insulation provided further enhances this effect.

Figure 2:
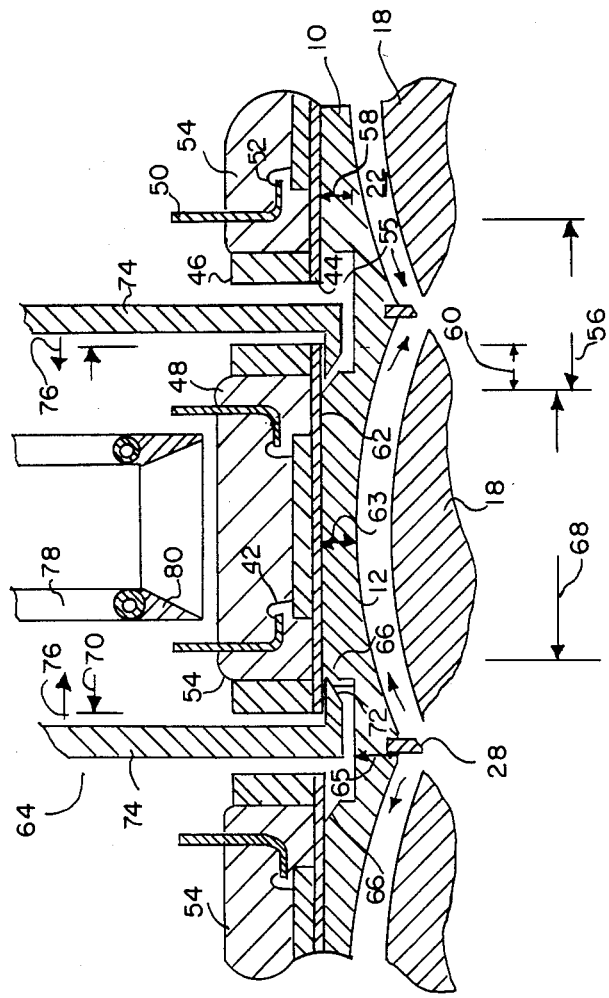
FIG. 2 is a partial cross-sectional view of the present invention illustrating a packaged semi-conductor chip mounted on a substrate provided with channels for simplified removal of said packaged chip.

A further embodiment of the present invention incorporates an intermediate heat sink substrate to which the chip is bonded which in turn is suitable for mounting on the larger heat sink substrate 10. Each chip may be independently packaged for simpler mounting and removal while retaining excellent heat removal capability. Referring now to FIG. 2, the back of chip 38 is bonded to intermediate substrate 44 in a thermally intimate manner with gold or other suitable means, as previously described. Intermediate substrate 44 is of a material whose thermal exposure reasonably matches that of the silicon, so that fracuring of the chip does not occur. Also, the thermal conductivity of the intermediate substrate, in combination with its thickness, should be such that the temperature drop across it is minimized. As discussed previously, a lower thermal conductivity can be offset by thinner material. In metals, tungsten or molybdenum have high thermal conductivity and approximately matching thermal expansion coefficients with silicon whereas other metals such as kovar, invar and zirconium have relatively poor thermal conductivity but are cheaper. Ceramics such as Alumina, beryllia, aluminium nitride, silicon carbide or variants thereof are also suitable if an electrical insulating intermediate substrate 44 is desired.

In general, intermediate substrate 44 is made slightly larger than chip 38. As a flat sheet stock it may be double-disc ground and polished to a very smooth surface on both sides thus enabling a high quality gold bonding between chip 38 and intermediate substrate 44. The small size of intermediate substrate 44 assures minimum cost for expensive materials such as tungsten. It may be necessary to prepare the surfaces of intermediate substrate 44 with a nickel flash or other means to facilitate bonding.

After bonding chip 38 to intermediate substrate 44, a stiffening frame 46, which may be stamped from kovar or other suitable material whose thermal expansion is an acceptable match to 44 is bonded to intermediate substrate 44 by adhesives such as epoxy, welding, brazing or other means. Frame 46 serves to stiffen flat member 44 and also serves to confine chip encapsulating material, such as plastic, 48. Pin leads 50 are electrically connected to chip 38 by leads 42. Pin leads 50 may be wire made from dispersion hardened copper thereby permitting small diameter wire, i.e., 0.010", to be used that is stiff and of high electrical conductivity. Pin lead wire 50 may be partially flattened at their ends 32 to facilitate bonding to leads 42. Additional periodic partial flattening of pin leads 50 in the encapsulant 48 serves to provide a strong anchoring means. The use of a flexible circuit as previously discussed minimizes mechanical stress on the pin leads 50 and permits a high pin lead density by virtue of the small diameter pin leads.

The exposed surface of intermediate substrate 44 of packaged semi-conductor 54 is mounted on and bonded to substrate 10 in a thermally intimate manner by suitable means such as a silver impregnated high thermal conductivity expoxy, thermal grease, brazing etc. The bonding means may be "hard", i.e., braze, hard expoxy etc. and thus rigid. It may be semi-rigid wherein a relatively reasonable force is required to remove the package 54 from substrate 10, or it may be "soft", i.e., thermal grease, wherein the package 54 is easily removed from suitable clamping means. The heat flux to be handled and desired operating temperatures will dictate which approach is most appropriate.

A further benefit of this embodiment is that intermediate substrate 44 serves to mechanically isolate chip 38. Thus, substrate 10 need not match the thermal expansion of semi-conductor chip 38. Substrate 10 may then be made of copper or an alloy, or other suitable material for high thermal conductivity and/or lower cost.

An important criteria in the design of semi-conductor device substrates such as the present invention or conventional PC boards is the ease and reliability of removal and replacement of defective components whether passive (resistors) or active (semi-conductor devices). In the January issue of *Electri-onics*, pages 23-26, J. Holdway discusses the various methods for component removal and their problems.

With the present invention, a substrate design that lends itself to ease of component removal is shown in FIG. 2. In FIG. 2 substrate 10 of FIG. 1 is modified by cutting, milling, forming or other means such as chemical milling, slots 55 of width 56 and depth 58. Slots 55 are centered over the juncture of adjacent liquid cooled periodic curves 12 and extend the length 15 (FIG. 1) of said periodic curves. This centers substrate mounting surface 62 of width 68 over curved liquid cooled heat exchange surface 12 where the most efficient heat transfer takes place by virtue of the thinnest wall thickness 63. In addition, maximum wall thickness 65 occurs at the juncture of adjacent curved surfaces 12 thereby enabling reasonable slot 55 depths 58 while maintaining optimum wall thicknesses 63 at the center of curved surfaces 12. Substrate mounting width 68 is such that device package 54 or chip 38 (FIG. 1) of width 70 is greater than 68, and therefore extends beyond substrate mounting surface 62 a pre-determined distance 60, such as 0.005" to 0.250". Width 68 of substrate mounting surface 62 may be periodically varied along its length 16 to accommodate different package width 70, thus adapting the design to different package 54 sizes.

A package or chip removal tool 64 may be positioned in slots 55 and under both overhangs of package 54. Each edge of substrate mounting surface 62 is beveled 66 or formed in some manner along substantially its entire length so as to enable removal tool 64 to be precisely positioned for removal of package 54. The wedge shape tips 72 of removal tool 64 serves to provide a lifting force when the jaws 74 are brought together 76. The tips 72 of removal tool 64 may also be in the shape of thin knife blades which can cut, with the aid of heat or movement, i.e., rotation or ultra-sound or other means, the bonding material holding package 54 to substrate 10 mounting surface 62. A wire saw blade may also be used.

With wedge shaped tips 72, sudden inward 76 sharp blows on tool arms 74, as might be applied by pulsed solenoid driven armatures could apply tremendous localized forces to break loose package 54. In combination with the above, or alone, heat could be applied by shrouding tool 64 and blowing heated gas, such as air or nitrogen, over the top of package 54, the heat transferring through the package to substrate surface 62. A the package 54 - substrate 62 interface, while not heating high resistivity materials such as encapulant 48, is by the use of induction heating. This technique also substantially avoids heating device packages adjacent the one being removed. One means by which this may be accomplished is to place miniaturized RF coil 78 and RF concentrator 80 in close proximity to device package 54. RE concentrator 80 is shaped for optimum RF coupling into package 54. A high energy RF pulse from a RF generator, typically of a few seconds or less, is applied to coil 78 and concentrator 80 directs this energy into intermediate substrate 44 or substrate 62 or other conductive surface in close proximity to concentrator 80 causing a rapid, localized temperature rise. The thermal shock, many times greater than that which the package-bonding substrate is designed to handle, can break loose a hard bonding material such as epoxy by differential expansion, between intermediate substrate 44 and substrate 62. The heat could also melt or soften a solder joint or joint or other material. Removal tool 64 may be used in conjunction with the above RF heating thus simultaneously applying heat and mechanical force. The dimensions of RF coil 78 and concentrator 80 as well as the RF frequency are selected to provide optimum coupling into package 54 while not disturbing or damaging adjacent components.

Solid state lasers can also benefit from the cooling characteristics of the present invention by enabling higher operating currents, and therefore higher output power as well as enabling multiple lasing devices to be mounted on a single chip in close proximity to each other. This can enable complex mixing schemes to be achieved from different wave length devices on a single chip. For example, adjacent devices can be constructed to have sequential but slightly overlapping voltage or otherwise tuneable bandwidths. Thus, a compact broad band optical receiver, frequency generator, mixer or any combination thereof can be constructed on a single chip.

A further preferred embodiment of the present invention provides for the thermally intimate mounting on semi-conductor substrate 10 of passive components with high heat flux dissipation requirements, such as miniaturized resistor networks used in power devices. Here the total power may be modest but the heat flux may be high by virtue of the heat being dissipated in a small area. Mechanical and thermal techniques as well as electrical interconnections between semi-conductor chips and passive components can be miniaturized and mounted in closer proximity to each other thereby reducing space requirements and improving electrical characteristics such as reduced capacitance and parasitics.

A further benefit of the present invention reside in that the use of dielectric liquid coolants such as fluorocarbons permit the construction of high power, high voltage assemblies by stacking, voltagewise, one element on top of another, as might be used witl thyristors. All assemblies may be fed in parallel or series by liquid coolant flow, because dielectric liquids, such as fluorocarbons, enable large voltage differentiate to be maintained between, for example, thyristor stages without voltage breakdown or discernable electrical leakage. This is not practical using water as a coolant. Thus, the present invention permits compact, high power and high voltage packages comprising series electrically connected semi-conductor devices to be assembled.

It will be understood that the above description is of preferred exemplary embodiments of the present invention and that the invention is not limited to the specific forms shown. Modification may be made in the design and arrangement of the elements without departing from the spirit of the invention as expressed in the appended claims.

I claim:

1. A semi-conductor heat sink structure including at least one surface suitable for bonding one or more semi-conductor devices in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, the improvement wherein said heat exchange surface includes:
   means, disposed on said heat exchange surface for providing coolant liquid flow over substantially the entirety of said surface and for forming pressure gradients in said liquid having a component perpendicular to said heat exchange surface without substantially impeding the relative velocity between the heat exchange surface and said liquid, said component having a magnitude directly proportional to the square of the relative velocity between said heat exchange surface and said liquid, to facilitate removal of said nucleate bubbles.

2. The semi-conductor heat sink structure of claim 1, further comprising:
   means disposed on said heat exchange surface, for forming nucleate bubbles of predetermined size and distribution to thereby increase heat flux.

3. A semi-conductor heat sink structure including a planar external surface suitable for bonding one or more semi-conductor devices in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, the improvement wherein said heat exchange surface includes:
   means wherein the interior surface of said heat sink structure contains one or more adjacent periodic curves across substantially the width of said structure and extending substantially the length of said structure and wherein a liquid coolant diverter is structured in close proximity to said heat exchange surface to provide predetermined liquid flow conditions at said heat exchange surface.

4. A semi-conductor heat sink structure including at least one surface suitable for bonding one or more semi-conductor devices in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, said heat exchange surface further includes means disposed on said heat exchange surface, for forming pressure gradients in said liquid having a component perpendicular to said heat exchange surface without substantially impeding the relative velocity between the anode heat exchange surface and said liquid, said component having a magnitude directly proportional to the square of the relative velocity between said anode heat exchange surface and said liquid, to facilitate removal of said nucleate bubbles, the improvement wherein said surface for bonding semi-conductor devices includes:

channels of predetermined depth and width adjacent to at least two opposite sides of said semi-conductor device.

5. A semi-conductor heat sink structure including at least one surface suitable for bonding one or more semi-conductor devices in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, said heat exchange surface further includes means, disposed on said heat exchange surface for forming pressure gradients in said liquid having a component perpendicular to said heat exchange surface without substantially impeding the relative velocity between the heat exchange surface and said liquid, said component having a magnitude directly proportional to the square of the relative velocity between said heat exchange surface and said liquid, to facilitate removal of said nucleate bubbles, the improvement wherein said surface for bonding semi-conductor devices includes:

channels of predetermined depth and width adjacent to at least two opposite sides of said semi-conductor device and underlying, to a pre-determined distance, said semi-conductor device wherein a semi-conductor device removal tool may be inserted for the removal of said semi-conductor device.

6. A semi-conductor heat sink structure including a planar surface suitable for bonding one or more semi-conductor devices in intimate thermal relationship thereto, and including a heat exchange surface on the interior surface thereof, said structure providing means for enclosing said heat exchange surface in a liquid tight manner and including means for providing a flow of coolant liquid to remove heat from said heat exchange surface by formation of nucleate vapor bubbles on said heat exchange surface, said heat exchange surface further includes one or more adjacent periodic curves across substantially the width of said structure and extending substantially the length of said structure and wherein a liquid coolant diverter is structured in the heat exchange region to provide predetermined liquid flow conditions in the proximity of said heat exchange surface, the improvement wherein said surface for bonding semi-conductor devices includes:

channels of predetermined depth and width adjacent to at least two sides of said semi-conductor device and underlying, to a pre-determined distance, said semi-conductor device wherein a semi-conductor device removal tool may be inserted to provide a force for the removal of said semi-conductor device.

7. In the apparatus of claim 4 the further improvement wherein said heat exchange surface is prepared with means disposed on said heat exchange surface, for forming nucleate bubbles of predetermined size and distribution to thereby increase heat flux.

8. In the apparatus of claim 6 the further improvement wherein said heat exchange surface is prepared with means disposed on said heat exchange surface, or forming nucleate bubbles of predetermined size and distribution to thereby increase heat flux.

9. In the apparatus of claim 1 the improvement wherein said means for generating pressure gradients comprises said heat exchange surface and said heat exchange surface comprises a contoured surface having a predetermined periodic geometry.

10. In the apparatus of claim 3 the further improvement wherein each said period of curve is provided with ducting for the alternate injection and removal of said coolant.

11. In the apparatus of claim 6 the further improvement wherein each said period or curve is provided with ducting for the alternate injection and removal of said coolant.

12. In the apparatus of claim 11 the further improvement wherein said predetermined periodic curves comprises flutes with flattened cusps.

13. In the apparatus of claim 6, the further improvement wherein said periodic curves are segments of circular arcs.

14. In the apparatus of claim 6 the further improvement wherein said liquid coolant comprises a dielectric composition.

15. In the apparatus of claim 6, the improvement wherein means are provided at the juncture of said periodic curves to join upper and lower internal surfaces of said structure whereby rigidity is provided to said structure.

16. In the apparatus of claim 2, the further improvement wherein said means comprises cavities and said cavities have dimensions in the range of 0.002 mm to 0.2 mm, and said cavities being spaced apart on said heat exchange surface said spacing generally ranging from 0.03 mm to 3 mm whereby more efficient heat transfer is obtained.

17. In apparatus of claim 2 the further improvement wherein said heat exchange surface has intimately adherent thereto a thin porous metal layer.

18. In the apparatus of claim 17 the further improvement wherein said porous metal is of relatively uniform pore size.

19. In the apparatus of claim 6 the further improvement wherein said substrate surface is made from a metal selected from the group consisting of tungsten, molybdenum or zirconium, or crystalline carbon or variants thereof.

20. In the apparatus of claim 6 the further improvement wherein said substrate surface is made from a ceramic selected from the group consisting of silicon carbide, alumina, beryllia, aluminum nitride or variants thereof.

21. In the apparatus of claim 6, wherein a viscous sublayer exists proximate said heat exchange surface, the further improvement wherein said heat exchange surface is further prepared with roughness said roughness having heights ranging from 0.0001" to 0.008" above said heat exchange surface whereby the viscous sublayer may be broken up.

22. In the apparatus of claim 6 the further improvement wherein said semi-conductor chip is bonded to an intermediate substrate of specified expansion and thermal transfer characteristics, provided with leads and encapsulated and the resulting packaged semi-conductor device then bonded in a thermally intimate manner to said semi-conductor heat sink structure thereby providing high heat transfer and simplifying removal and replacement of defective devices.

23. In the apparatus of claim 6 the further improvement wherein said channels have the wall, underlying and adjacent said semi-conductor device, shaped wherein said device removal tool may be precisely and advantageously positioned.

24. In the apparatus of claim 23 said shape of wall comprises a bevel.

25. In the apparatus of claim 6 the further improvement wherein said heat exchange surface is prepared with cavities said cavities have dimensions in the range of 0.002 mm to 0.2 mm, and said cavities being spaced apart on said heat exchange surface said spacing generally ranging from 0.03 mm to 3 mm whereby more efficient heat transfer is obtained.

26. In the apparatus of claim 6, the further improvement wherein said liquid coolant comprises a non-dielectric composition.

27. In the apparatus of claim 14, wherein said dielectric composition is a fluorocarbon refrigerant.

28. In the apparatus of claim 26, wherein said non-dielectric composition is water.

29. In the apparatus of claim 25, wherein a viscous sublayer of laminar flow tends to form immediately adjacent said heat exchange surface bounded superiorly by a transition zone to turbulent flow of said liquid, the further improvement wherein said cavities comprise truncated cones whose bases are affixed to the heat exchange surface, said cones containing approximately centered cavities which are exposed to the liquid, the cone height being not less than 0.3 times the height of the viscous sublayer nor more than twice the combined height of the viscous sublayer and the transition zone.

30. In the apparatus of claim 25, the further improvement whereby the inside surface of said cavities is prepared with micro cavities, the dimensions of said micro cavities being in the range of from about $1 \times 10^{-4}$ mm to $1 \times 10^{-2}$ mm.

31. In a heat sink for structurally supporting at least a portion of a heat generating device in intimate thermal relationship therewith and for removing heat flux from the region of thermal contact therebetween at or about a heat exchange surface, said heat sink providing a heat exchange fluid environment proximate said heat exchange surface and including flow means for providing a current of coolant fluid to remove heat from said heat exchange surface by formation of nucleate vapor bubbles thereon, the improvement comprising fluid pressure developing means disposed on said heat exchange surface for forming pressure gradients in said coolant fluid having a pressure component generally perpendicular to said surface while maintaining generally constant the relative flow velocity of fluid relative to said surface, said pressure component having a magnitude directly proportional to the square of the relative velocity between said heat exchange surface and said fluid, to facilitate removal of said nucleate bubbles, and further wherein coolant flows over substantially the entirety of said heat exchange surface.

* * * * *